United States Patent [19]
Chesley

[11] 4,038,648
[45] July 26, 1977

[54] SELF-CONFIGURABLE CIRCUIT STRUCTURE FOR ACHIEVING WAFER SCALE INTEGRATION

[76] Inventor: Gilman D. Chesley, 22431 Starling Drive, Los Altos, Calif. 94022

[21] Appl. No.: 475,748

[22] Filed: June 3, 1974

[51] Int. Cl.² .......................................... G11C 11/40
[52] U.S. Cl. ..................... 340/173 R; 324/73 PC; 364/900
[58] Field of Search ............ 324/73 R, 73 PC; 340/172.5, 173 R, 173 BB

[56] References Cited

U.S. PATENT DOCUMENTS

| | | | |
|---|---|---|---|
| 3,222,653 | 12/1965 | Rice | 340/172.5 |
| 3,234,521 | 2/1966 | Weisbecker | 340/173 BB |
| 3,434,116 | 3/1969 | Anacker | 340/173 BB |
| 3,478,286 | 11/1969 | Dervan | 340/173 BB |
| 3,714,637 | 1/1973 | Beausoleil | 340/173 BB |
| 3,803,562 | 4/1974 | Hunter | 340/173 R |
| 3,810,301 | 5/1974 | Cook | 340/173 R |
| 3,882,470 | 5/1975 | Hunter | 340/173 R |
| 3,900,837 | 8/1975 | Hunter | 340/173 R |

FOREIGN PATENT DOCUMENTS

| | | |
|---|---|---|
| 982,268 | 1/1976 | Canada |

*Primary Examiner*—Terrell W. Fears
*Attorney, Agent, or Firm*—Flehr, Hohbach, Test, Albritton & Herbert

[57] ABSTRACT

A self-configurable circuit structure and method for forming the same, for achieving wafer scale integration including the combination of an integrated circuit wafer having an input and an output, wafer control means to provide test and operational modes, at least one unit circuit on the wafer connected to the wafer control means, coupled between the wafer input and output. The unit circuit includes a semi-conductor chip, test means for functional testing of the chip and circuit control means responsive to the output of the test means to intercouple the unit circuit if it is properly functioning between the wafer input and output to form a functional circuit.

13 Claims, 5 Drawing Figures

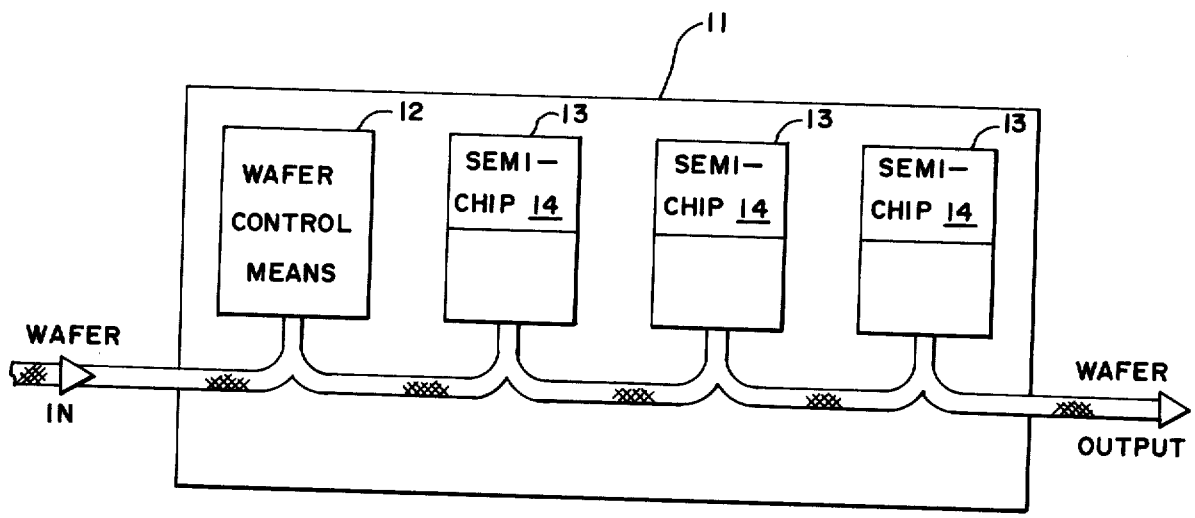
FIG.—1A
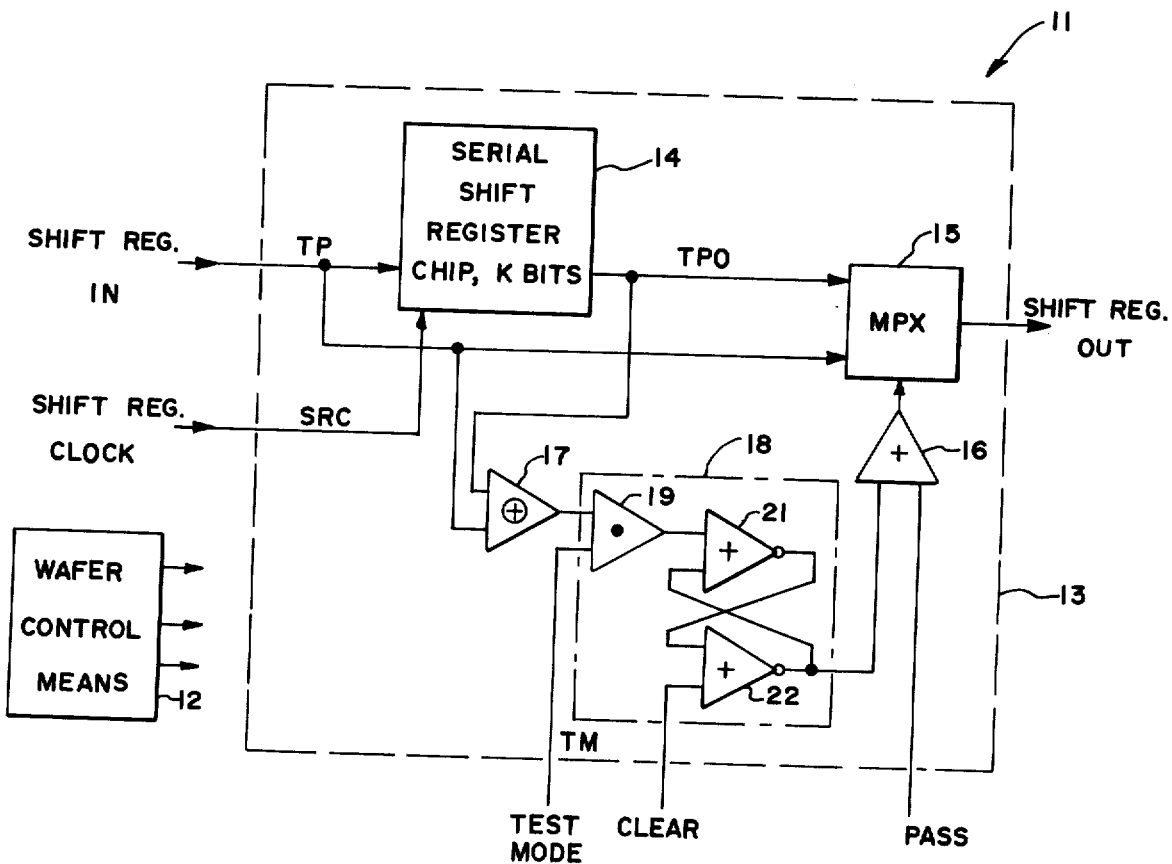
FIG.—1B

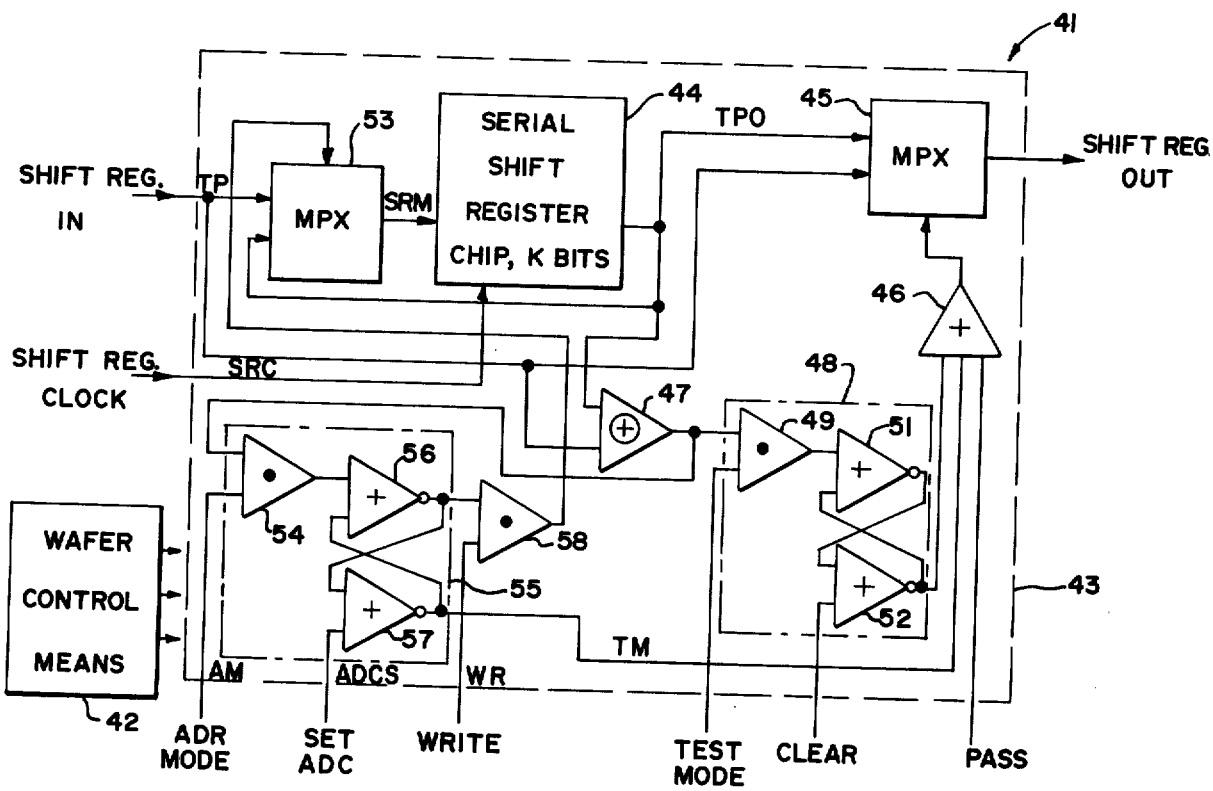
FIG.—2
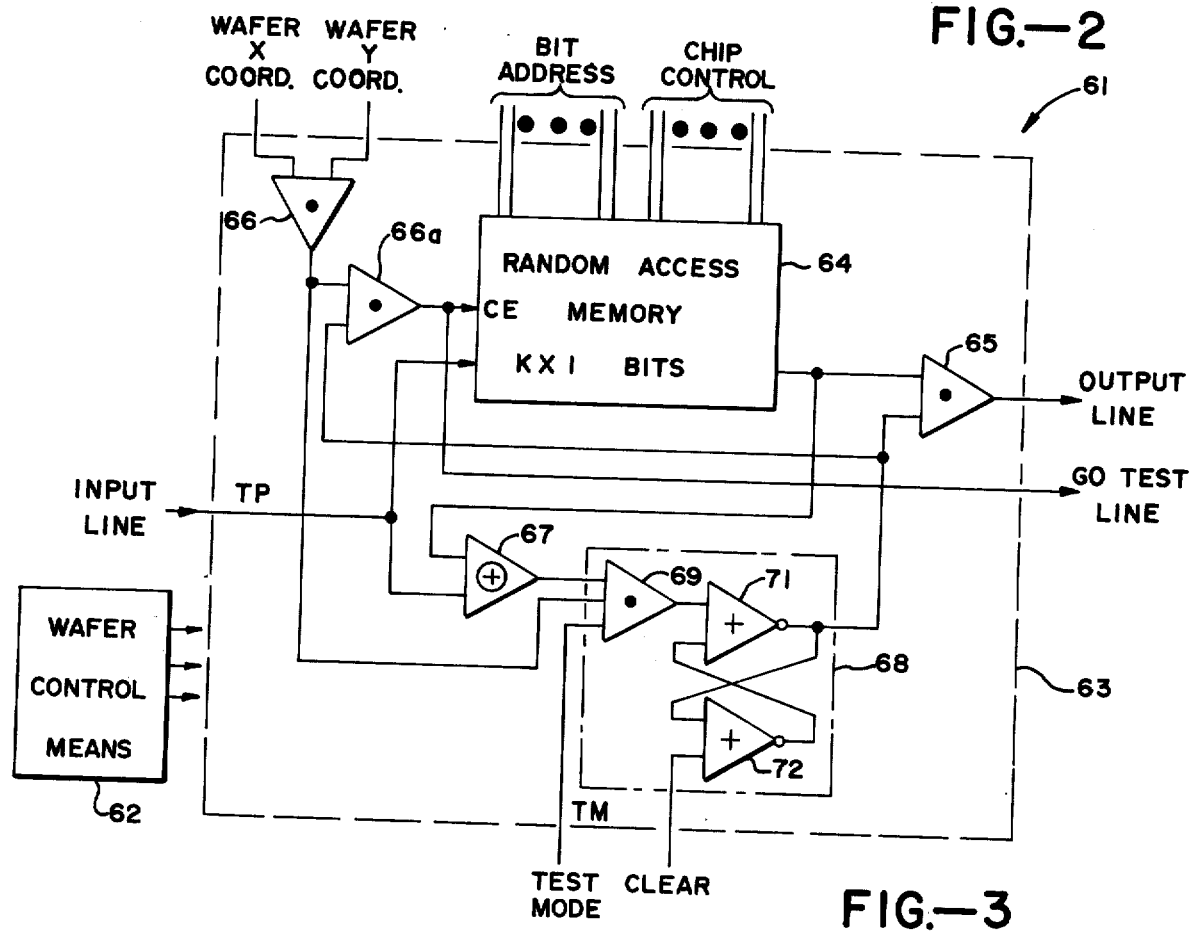
FIG.—3

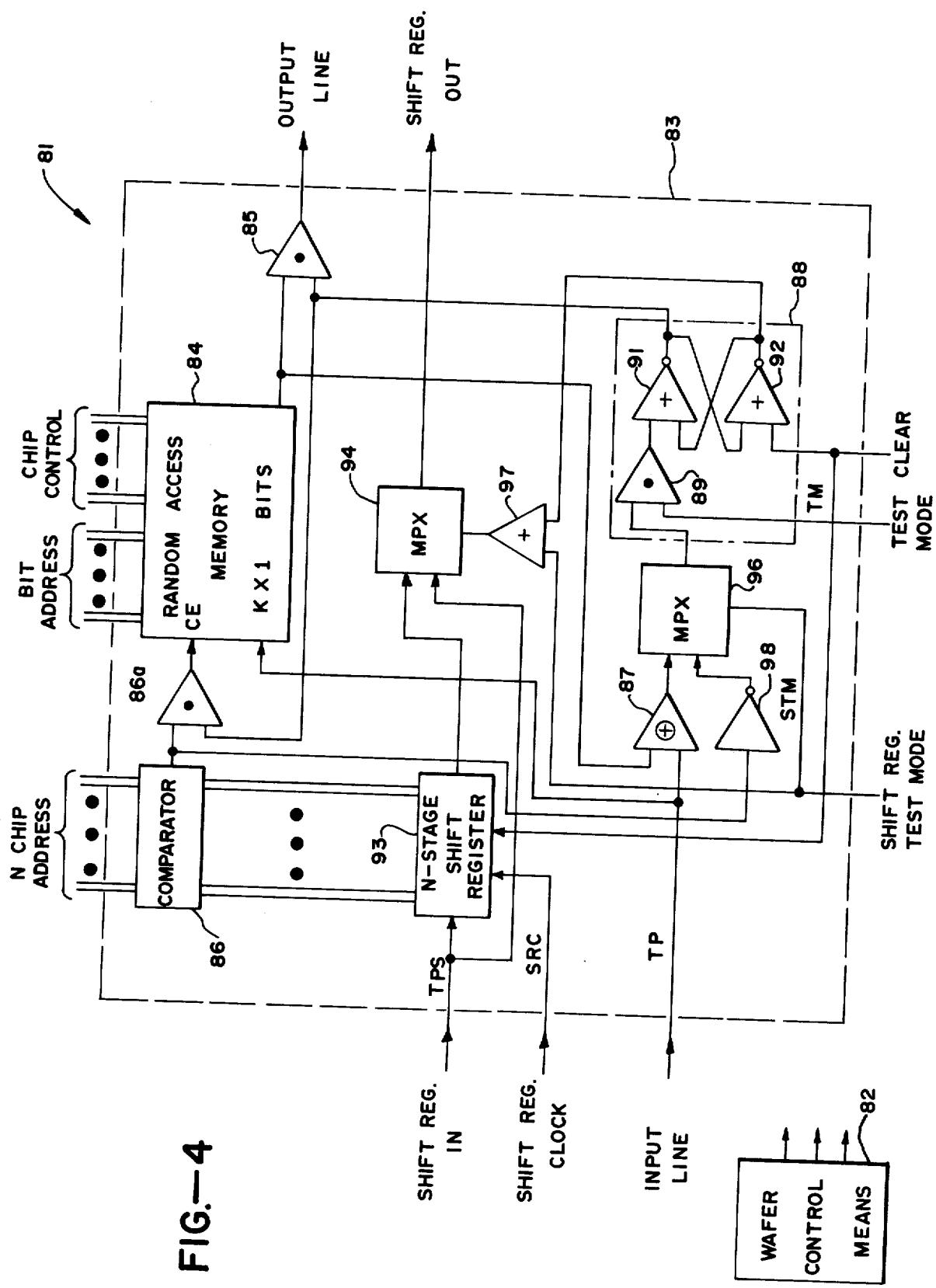

SELF-CONFIGURABLE CIRCUIT STRUCTURE FOR ACHIEVING WAFER SCALE INTEGRATION

BACKGROUND OF THE INVENTION

This invention relates generally to a circuit structure capable of active self-configuration to achieve wafer scale integration. More particularly the invention includes an integrated circuit wafer having plural unit circuits, together with functional testing and control means to configure functional circuits on the wafer.

It is well known in the manufacture of integrated circuit wafers, that as wafer size and complexity increase so also does the likelihood that manufacturing imperfections will appear in some of the chips on the wafer. Only one of the individual chips produced need be imperfect and malfunction to render an entire wafer inoperable as a single unit. In the prior art, all the chips on a wafer were tested, and those found to be functional were diced or separated out and repackaged. Then a series of such functional packages were interconnected to form a functional circuit. Various ways to circumvent or minimize the testing, dicing and repackaging steps, that is, to utilize the manufactured wafer as completely as possible without additional ancillary processing steps, became known as wafer scale integration. In so utilizing the manufactured wafer, it is highly desirable to minimize the processing steps required to make the wafer operational and at the same time to integrate, to the maximum possible extent, large scale portions of the wafer.

Prior art achieved wafer scale integration by a process called discretionary wiring. In discretionary wiring, the chips on a wafer are probed, tested, and the test results fed to a computer which determines an interconnect mask corresponding to a map of the functional chips on the wafer. Interconnection layers are then formed between functional chips using the computer-determined mask. Key drawbacks are the cost of the computer and the reprocessing system. Moreover, the interconnection is fixed and static; incapable of assimilating subsequent chip malfunctions.

SUMMARY OF THE INVENTION AND OBJECTS

It is a general object of the present invention to provide a self-configurable circuit structure for achieving improved wafer scale integration.

It is another object of the present invention to provide a circuit structure which accomplishes improved wafer scale integration by active, dynamic unit circuit intercoupling capable of subsequent reconfiguration of the conduit structure as desired and when malfunctions occur.

It is another object of the present invention to provide a method for active and dynamic intercoupling, configuration and reconfiguration of a circuit structure.

The foregoing and other objects of the invention are achieved by a self-configurable circuit structure and method for forming the same, including the combination of an integrated circuit wafer having an input and an output, wafer control means to provide test and operational modes, at least one unit circuit on the wafer connected to the wafer control means, coupled between the wafer input and output. The unit circuit includes a semiconductor chip, test means for functional testing of the chip and circuit control means responsive to the output of the test means to intercouple the unit circuit if it is properly functioning between the wafer input and output to form a functional circuit.

BRIEF DESCRIPTION OF THE DRAWINGS

FIG. 1A is a block diagram of a self-configurable plural unit circuit structure on a wafer.

FIG. 1B is a block diagram of a serial shift register embodiment of the FIG. 1A unit circuit and structure.

FIG. 2 is a block diagram of a serial shift-parallel access embodiment of the FIG. 1A unit circuit.

FIG. 3 is a block diagram of a random access memory embodiment of the FIG. 1A unit circuit.

FIG. 4 is a block diagram of a random access memory and unit circuit address embodiment of the FIG. 1A unit circuit.

DESCRIPTION OF THE PREFERRED EMBODIMENTS

A plurality of self-configurable integrated circuit structures are shown in the accompanying Figures. As will be seen additional control and test means are provided to determine if each unit circuit is functional before it is operationally coupled into the wafer scale circuit.

Referring to FIG. 1A a semiconductor wafer 11 is shown including wafer control means 12 and plural unit circuits 13 including semiconductor chips 14 formed on wafer 11. The invention is formed integrally on the wafer 11. However, the wafer control means 12 and portions of the unit circuit 13 other than the semiconductor chips 14 may be formed of logic on a second wafer (not shown) and connected to the respective plural chips 14 on wafer 11.

Referring to FIG. 1B, a serial embodiment of one of the plural unit circuits on FIG. 1A is shown. Unit circuit 13 is one of plural unit circuits 13 on wafer 11 having wafer control means 12. In this embodiment, each unit circuit 13 on the wafer 11 includes a semiconductor chip 14 configured as a $k$ bit, serial shift register, multiplexer 15, OR gate 16, exclusive OR gate 17 and latch 18 including AND gate 19 and NOR gates 21 and 22.

More particularly a SHIFT REG IN line is connected to the signal input of shift register 14, and a SHIFT REG CLOCK line is connected to the clock input of shift register 14. Shift register 14 has an output line connected to a first input of multiplexer 15 and to a first input of exclusive OR gate 17. The SHIFT REG IN line is also connected to the second input of multiplexer 15 and to the second input of exclusive OR gate 17. The output of exclusive OR gate 17 is connected to a first input of latch 18. The TEST MODE line is connected to a second input of latch 18. A CLEAR line is connected to a third, CLR input of latch 18. Latch 18 includes a first AND gate 19 having first and second inputs connected to the respective latch 18 inputs, and with the gate 19 output connected to a first input of NOR gate 21. A second NOR gate 22 has a second input connected to the CLEAR input line, and a first input is connected to the output of NOR gate 21. A second input of gate 21 is connected to the output of NOR gate 22. The output of NOR gate 22 is connected to the output of latch 18 which is connected to a first input of bypass OR gate 16. A PASS line is connected to the second input of gate 16 and the output of gate 16 is connected to the actuation or energizing input of multiplexer 15. The output of multiplexer 15 is connected to the SHIFT REG OUT line. Plural unit circuits 13 on wafer 11 are serially interconnected with the SHIFT REG OUT output line of first unit circuit 13 connected to the SHIFT REG IN line of the second circuit 13 and so on to connect all circuits on the wafer 11.

In operation the wafer control means 12 provides prior to the normal operational mode, a test mode wherein the plural unit circuits 13 are cycled through a TEST cycle wherein a CLEAR signal goes high briefly to set the latch 18, the PASS signal goes high to actuate gate 16 and multiplexer 15 to bypass the SHIFT REG IN line to the SHIFT REG OUT line in each of the Plural unit circuits 13 on wafer 11, thereby connecting all unit circuit inputs and outputs. Next the wafer control means 12 provides a test pattern signal TP which is applied to the first unit circuit 13 and via multiplexer 15 to successive unit circuits 13. Within each unit circuit 13 the test pattern signal TP is applied to shift register 14. The test pattern signal TP input to shift register 14 is compared with the shift register output signal TPO is exclusive OR comparator 17. The wafer control means 12 provides a pulsed TM signal only at selected time periods when register 14 input and output signals compare in properly functioning shift register circuits. Of course such time periods may be conveniently selected by choice of the test pattern signal TP and with knowledge of the propagation time of the test pattern signal TP through register 14 clocked by signal SRC from the wafer control means 12. At such selected time periods and when the register inputs and outputs do not compare, the signal output of gate 17 and signal TM coincide, and latch 18 resets. Next, the wafer control means 12 removes the PASS signal input from all unit circuits 13 and thereby from gates 16. The gates 16 in nonfunctional unit circuits 13 continue to be activated by the reset GO output from latch 18 and thus continue to be bypassed. If on the other hand, a particular unit circuit 13 is properly functioning, then it is intercoupled with other successive like circuits when the PASS signal falls, OR gate 16 deactivates multiplexer 15 so it no longer bypassed the register 14. Thus the test cycle is completed and the wafer control means 12 may then begin the normal operational cycle.

The wafer shift register formed to a given length by serially intercoupling unit circuits 13 may be combined with other like wafers of different lengths to arrive at a desired length. Or the wafer control means 12 may additionally incorporate means for determining the number of functional unit circuits intercoupled and cease intercoupling when a desired, predetermined number of circuits have been intercoupled. For example, an additional configuration line may be added serially linking all unit circuits 13 having additional bit detection logic. At the end of the test cycle, additional wafer control means 12 is required to provide two m-spaced serial bits on the configuration line where m is the desired number of functional unit circuits for a predetermined wafer register length. Operation requires the additional steps of delaying the first bit one bit period in each functional unit circuit 13 and when the bits are adjacent bypassing further unit circuits. Remaining functional unit circuits on the wafer remain in reserve should any of the previously functioning circuits fail. If a failure occurs, the test cycle is repeated, the nonfunctional circuit is bypassed, an additional functional circuit is incorporated and the operational cycle may continue.

Referring to FIG. 2, a serial shift-parallel access embodiment of one of the plural unit circuits of FIG. 1A is shown. Unit circuit 43 is one of plural unit circuits 43 on wafer 41 having wafer control means 42. In this embodiment, each of the unit circuits 43 on wafer 41 includes a semiconductor chip shift register 44, an output multiplexer 45, OR gate 46, exclusive OR gate 47, latch 48 including AND gate 49 and NOR gates 51 and 52, input multiplexer 53, address compare latch 55 including AND gate 54 and NOR gate 56 and 57 and AND gate 58. More particularly, a SHIFT REG IN line in connected to the first input of multiplexer 53, to a second input of multiplexer 45, and to a second input of exclusive OR gate 47. The output of multiplexer 53 is connected to the input of shift register 44. A SHIFT REG CLOCK line is connected to the clock input of shift register 44. The output of shift register 44 is connected to a first input of multiplexer 45, to a first input of exclusive OR gate 47, and to a second input of multiplexer 53. The actuation or energizing input to multiplexer 53 is connected to the output of AND gate 58.

The address and WRITE logic includes gates 54, 56, 57, connected as latch 55, and gate 58. The output of exclusive OR gate 47 is connected to a first input of gate 54. An address mode ADR MODE line is connected to a second input of AND gate 54. The output of AND gate 54 is connected to a first input of NOR gate 56. A SET ADC address control line is connected to a second input of NOR gate 57. The output of gate 56 is also connected to a first input of AND gate 58. A WRITE input line is connected to a second input of AND gate 58. The output of gate 57 is also connected to a second input of OR gate 46.

The output of exclusive OR gate 47 is also connected to a first input of latch 48. A TEST MODE input line is connected to a second input of latch 48. Latch 48 includes NOR gates 51, 52 and AND gate 49 having first and second inputs connected to the first and second inputs of latch 48 respectively. The output of AND gate 49 is connected to a first input of NOR gate 51. A CLEAR line is connected to a third input to latch 48 which includes a second input to NOR gate 52. The output of NOR gate 52 is connected to a second input of NOR gate 51. The output of NOR gate 51 is connected to a first input of NOR gate 52. The output of NOR gate 52 which is a first output of latch 48 is connected to a first input of OR gate 46. A PASS line is connected to a third input of gate 46. The output of gate 46 is connected to the actuation or energizing input of multiplexer 45. The output of multiplexer 45 is connected to the SHIFT REG OUT line.

In operation, the wafer control means 42 provides prior to the normal operational mode, a test mode wherein plural unit circuits 43 are cycled through a TEST cycle wherein a CLEAR signal goes high briefly to set latch 48, an ADCS signal is briefly applied to set latch 55 and a WRITE signal is supplied to gate 58 which actuates multiplexer 53 for normal load action of the shift registers. A PASS signal actuates gate 46 and multiplexer 45 to bypass the SHIFT REG IN line to the SHIFT REG OUT of the plural unit circuits 43 on wafer 41, thereby connecting all unit circuit inputs and outputs.

Next the wafer control means provides a test pattern signal TP which is applied to the first unit circuit 43 and via multiplexer 45 to successive unit circuits 43. Within each unit circuit 43 the test pattern signal TP is applied to the input multiplexer 53 which is actuated and connects the test pattern signal to shift register 44. The test pattern signal TP input to shift register 44 is compared with the shift register output signal TPO in exclusive OR comparator 47. The wafer control means 42 provides a pulsed TM signal only at selected time periods when register 44 input and output signals compare in properly functioning shift register circuits. As previously discussed such time periods may be conveniently selected by choice of the test pattern signal TP and with knowledge of the propagation time of the test pattern signal TP through register 44 clocked by signal SRC from wafer control means 12. At such selected time periods and when the register inputs and outputs do not compare, the signal output of gate 47 and signal TM coincide and latch 48 resets. Next, the wafer control means 12 removes the PASS signal input from all unit circuits 43 and accordingly from gates 46. The gates 46 in nonfunctional unit circuits 43 continue to be activated by the reset GO output from latch 48 and thus continue to be bypassed. Thus nonfunctional unit circuits 43 remain bypassed and functional circuits 43 are intercoupled with other successive like circuits. The test is now completed and the operational cycle may begin.

Next the wafer control means 42 shifts unique addresses having reserved space interleaved for data through the serially intercoupled plural unit circuits 43. Next the WRITE signal is removed, allowing multiplexer 53 to connect shift register 44 output to input and the data is allowed to circulate within each shift register 44, and the PASS signal is again turned on.

Prior to performing a read or write operation in the operational mode an address comparison or exact match between the unique stored addresses and a submitted serial address must be found. First an ADCS pulse sets ADC latches 55 on plural unit cicuits 43. Next AM is pulsed on only for the time that a serial address is submitted on plural input lines. Within each unit circuit the submitted address is compared with the unique stored address in comparator 47. The submitted address will match with no more than one of the stored addresses and all unit circuits 43 except the unit circuit having a matching address will not compare in respective gates 47. The output from gates 47 will provide a first input to gates 54 which reset latches 55. Next the AM signal is removed from all circuits and a read or write operation may begin.

Returning to the unique unit circuit 43 having an exact match or compared address with the submitted serial address, either a read or write operation may now be performed in this unit circuit. For a read operation the PASS signal input to gate 46 is removed. At this point in the operational cycle the PASS signal acts as a not READ signal. Only the unit circuit 43 having an exact match will have latch 55 on. Thus the unique chip will not continue to hold gate 46 high and thus will not be bypassed. Rather the contents of the shift register 43 will be read out to the common SHIFT REG OUT line. To finish the read cycle the PASS signal is turned on again.

To perform a WRITE operation the matching or address comparison previously described is first performed wherein a serial address submitted on all input lines is compared with the uniquely stored addresses in comparators 47. The stored addresses in the plural shift registers 44, except for the unique register 44 having a matching address, will mismatch and provide a first input for gate 54, thereby causing ADC latch 55 to reset. Next, to write, the WR line is turned on providing a second input to gates 58 and enabling gate 58 only in the unit circuit 43 having a uniquely matched address. The output of gate 58 provides an input to the actuation or energizing input of multiplexer 53, disconnecting the input of shift register 44 from the second, recirculation input of multiplexer 53, and connects the input of the shift register to the SHIFT REG IN line to receive data to be written. The write signal WR goes low to terminate the write operation.

Performing in this configuration, the serial shift-parallel access embodiment has the same organization and function as an associative memory. Of course, the identifying address field can be placed in any location within the shift register loop and it can be of any length consonant with the shift register length. Further the identifying field can contain any unique data or identifying descriptors by modification of the wafer control timing. Also, with proper modification of the control sequences, multiple identifying field and data fields may be used within a single shift register loop.

It is readily apparent that the serial shift-parallel access embodiment and operation is a superset of the FIG. 1B embodiment previously described. Operation in the FIG. 1B serial mode is accomplished by providing a pulse on the SET ADC input line, providing a WRITE input, and turning off the PASS input, thereby connecting the SHIFT REG OUT line to the SHIFT REG. IN line of successive chips. Operation may then take place as previously described in the FIG. 1B embodiment.

Referring to FIG. 3, a random access memory embodiment of one of the plural unit circuits of FIG. 1A is shown. Unit circuit 63 is one of plural unit circuits 63 on wafer 61 having wafer control means 62. In this embodiment, each unit circuit 63 on wafer 61 includes a random access memory semiconductor chip 64 having multiple cell storage locations capable of storing k bits, each storage cell of the memory being accessable upon coordinate address of that cell location. The random access memory chip shown in of conventional technology wherein the access time to any given location in memory is the same as the access time to any other location.

Each unit circuit 63 includes random access memory 64, output AND gate 65, chip select gate 66, chip enable gate 66a, exclusive OR comparator 67, and latch 68, including AND gate 69 and NOR gates 71 and 72.

More particularly, unit circuit 63 is one of plural unit circuits 63 formed on wafer 61. Common address, data access and control lines on wafer 61 are connected to each unit circuit 63. In the embodiment shown in FIG. 3, wafer X and Y coordinate lines select one of the plural unit circuits 63 described by the X and Y cartesian coordinate location of such circuit on wafer 61. Wafer bit address lines and wafer chip control lines connect to each unit circuit 63. The function of the wafer X and Y coordinate, bit address and chip control lines will be readily apparent when the operation of the embodiment is hereinafter described. Further wafer 61 having plural unit circuits 63 has common INPUT LINE, OUTPUT LINE and GO TEST LINE connected to each circuit 63. Likewise, common TEST MODE and CLEAR lines are connected in common to all unit circuits 63.

Each unit circuit 63 includes an INPUT LINE connected to the input of random access memory 64 and connected to a second input of exclusive OR gate 67. The output of random access memory 64 is connected to a first input of exclusiver OR gate 67 and connected to a first input of AND gate 65. The output of gate 65 is connected to the common OUTPUT LINE on wafer 61. The wafer 61 X and Y COORDINATE lines are connected to first and second inputs respectively of chip select AND gate 66. The output of gate 66 is connected to a first input of chip enable AND gate 66a. The output of chip select gate 66 is also connected to a second input of latch 68. Latch 68 has a first input connected to the output of gate 67. The TEST MODE line is connected to a third input of latch 68. A CLEAR line is connected to a CLEAR input of latch 68. Latch 68 includes AND gate 69 having first, second and third inputs connected to the respective first, second and third inputs of latch 68. The output of gate 69 is connected to a first input of NOR gate 71. The output of NOR gate 71 is connected to a first input of NOR gate 72. The output of NOR gate 72 is connected to a second input of NOR gate 71. The second input of NOR gate 72 is connected to the fourth latch 68 input line. The output of NOR gate 71 is connected to the output of latch 68 which is connected to a second input of AND gate 65 and connected to a second input of AND gate 66a. The output of the chip enable AND gate 66a, is connected to a second, chip enable, input of random access memory 64 and is also connected to the GO TEST LINE output. Common wafer BIT ADDRESS and CHIP CONTROL lines are connected to the bit address and chip control inputs of random access memory 64.

In operation the wafer control means 62 provides prior to the normal operational mode, a test mode wherein the plural unit circuits 63 are cycled through a TEST cycle wherein a CLEAR signal goes high briefly to set latches 68. Next the wafer control means 62 provides signal TP on the common INPUT LINE to each of the plural unit circuits 63. Next the wafer control means 62 addresses in any desired and convenient pattern the X and Y coordinate lines to select a particular chip and then the BIT ADDRESS lines and the CHIP CONTROL lines common to the wafer 61. Chips are tested one at a time using the X and Y COORDINATE, CHIP CONTROL and BIT ADDRESS lines. Preferably the wafer control means 62 writes a series or pattern of bits in each storage cell on each chip. Next the wafer control means 62 repeats the patterned address and reads all cells on the chips. The output from the read operation, connected to the first input of exclusive OR gates 67, is compared with the test pattern signal TP which the wafer control means 62 reapplies to the INPUT LINE. The comparison takes place on each of the unit circuits 63 in exclusive OR comparator 67. The output of comparator gate 67 is combined in gate 69 with the X—Y coordinate, which calls out the particular random access memory 64 under test, and the TM signal. At time periods that the TM signal is present and the signal output read from the random access memory 64 and the test pattern TP on the INPUT TEST line do not compare, the latch 68 output resets, removing the second input to AND gate 65 and thus interrupting the data to the OUTPUT LINE.

The output from chip select gate 66 is present only when the particular X—Y coordinates coincide to select a particular chip and it provides a second input to latch 68 thus enabling gate 69 only when the particular chip has been selected for testing. An output line from the output of chip enable gate 66a provides a reference for the wafer control means 62 so that the wafer control means 62 can log, using the GO TEST LINE, the unit circuits 63 which are functional and which are nonfunctional. Subsequently, the wafer control means 62 uses the logged information to generate X and Y coordinates only for properly functioning unit circuits 63 on wafer 62. The GO TEST LINE shows which chip is being tested so that the wafer control means 62 can log in the locations of functional and nonfunctional chips so that nonfunctional chips are not subsequently addressed. Alternatively, after testing a unit circuit a 1 could be read out of the chip to the output line indicating a good unit circuit by gate 65, and the GO TEST LINE could be eliminated.

Referring to FIG. 4, a random access memory embodiment of one of the plural unit circuits of FIG. 1A is shown. Unit circuit 83 is one of plural unit circuits on wafer 81 having wafer control means 82. In this embodiment each unit circuit 83 on wafer 81 includes a random access memory semiconductor chip 84 having multiple cell storage locations capable of storing k bits, each storage cell of the memory being accessable upon address of that cell location. Here also, the random access memory chip shown is of conventional technology wherein the access time to any given location in memory is the same as the access time to any other location.

Each unit circuit 83 includes random access memory chip 84, output AND gate 85, comparator 86, chip enable gate 86a, exclusive OR comparator 87, latch 88, including AND gate 89 and NOR gates 91 and 92, shift register 93, multiplexer 94, multiplexer 96, OR gate 97 and inverter 98.

More particularly, unit circuit 83 is one of plural unit circuits 83 formed on wafer 81. Wafer 81 includes common CHIP ADDRESS, BIT ADDRESS, CHIP CONTROL lines, INPUT LINE and OUTPUT LINE connected to each circuit 83. Likewise common TEST MODE, SHIFT REG TEST MODE, CLEAR, SHIFT REG CLOCK lines are connected in common to all unit circuits 83. Further each unit circuit 83 has a SHIFT REG IN line and a SHIFT REG OUT line serially interconnecting the plural unit circuits 83, that is SHIFT REG OUT of the first unit circuit 83 is connected to the SHIFT REG IN of the second circuit 83 and so on to serially interconnect all unit circuits 83 on wafer 81.

More particularly, within each unit circuit 83 the INPUT LINE is connected to the input of random access memory 84 and is also connected to a second input of exclusive OR comparator 87. The output of random access memory 84 is connected to a first input of exclusive OR comparator 87, and to a first input of AND gate 85. The output of gate 87 is connected to a first input of multiplexer 96. The output of multiplexer 96 is connected to a first input of latch 88. A TEST MODE line is connected to a second input of latch 88. A CLEAR line is connected to a third input to latch 88. Latch 88 includes AND gate 89 having first and second inputs connected to the first and second input of latch 88 respectively. The ourput of gate 89 is connected to a first input of NOR gate 91. The output of gate 91 is connected to a first input of NOR gate 92. The output of NOR gate 92 is connected to a second input of NOR gate 91. The output of NOR gate 91, which is a first output of latch 88 is connected to a second input of AND gate 85 and is connected to a second input of chip enable gate 86a. The output of gate 85 is a first output of unit circuit 83 and is connected to the common OUTPUT LINE of wafer 81. The output of chip enable gate 86a is connected to the chip enable input of random access memory 84. A first input of chip enable gate 86a is connected to the output of comparator 86. The output of comparator 86 is also connected to the input of inverter 98 which has an output connected to a second input of multiplexer 96.

Wafer 81 has n common CHIP ADDRESS lines connected to each unit circuit 83, the n CHIP ADDRESS lines connect to first inputs of comparator 86. The second array of n inputs to be compared in comparator 86 are connected to the corresponding parallel outputs of an n-stage shift register 93. The n output lines are connected to the parallel access outputs of each of the serial n-stages of shift register 93. The SHIFT REG IN line is connected to the input of shift register 93 and also to a second input of multiplexer 94. The SHIFT REG CLOCK line is connected to the clock input of shift register 93. The CLEAR line of wafer 81 is connected to the CLR input of shift register 93. The output of shift register 93 is connected to a first input of multiplexer 94. The actuation or energizing input of multiplexer 94 is connected to the output of OR gate 97. A second input to OR gate 97 is connected to the output of NOR gate 92 which is the second output of latch 88. A first input of OR gate 97 is connected to the SHIFT REG TEST MODE line. The SHIFT REG TEST MODE line is also connected to the actuation or energizing input of multiplexer 96. The output of multiplexer 94 is connected to the SHIFT REG OUT line of unit circuit 83 which is connected to the SHIFT REG IN line of the next successive unit circuit 83 on wafer 81 and so on to serially interconnect all unit circuits.

The embodiment in FIG. 4 includes both shift register 93 and comparator 86 testing and subsequently random access memory 84 testing. It may be found it is not necessary to test register 93, comparator 86 and its associated logic. In particular for relatively small arrays of unit circuits 83 it may not be necessary or desirable to test comparator 86 and shift register 93. If such is the case, multiplexer 96 may be omitted and the output of gate 87 connected directly to the first input of latch 88. Further inverter 98, gate 97, multiplexer 94 and the SHIFT REG TEST MODE line may be omitted and the output of shift register 93 connected directly to the unit circuit 83 SHIFT REG OUT line. Likewise, the shift register operational test sequence described below may be likewise omitted.

In operation, the wafer control means 82 provides prior to the normal operational mode, a test mode wherein the plural unit circuits 83 are cycled through a TEST cycle wherein a CLEAR signal goes high briefly to set latches 88, and clear shift registers 93 to all zeros. The n CHIP ADDRESS lines are also set to all zeros. Next the wafer control means 82 provides a test pattern signal TP on the common INPUT LINE to each of the plural unit circuits 83. Next the wafer control means 82 addressed in any desired and convenient pattern the BIT ADDRESS lines and CHIP CONTROL lines common to the wafer 81. Unit circuits 83 are all tested in parallel. Preferably the wafer control means 82 writes a series or pattern of bits in each storage cell of random access memorys 84 on the wafer 81 using the CHIP CONTROL and BIT ADDRESS lines. Next the wafer control means 82 repeats the patterned address and reads all cells on the wafer. The output from the read operation connected to the first input of exclusive OR gate 87, is compared with the test pattern signal TP which the wafer control means 82 reapplies to the INPUT LINE. The comparison takes place simultaneously on each of the unit circuits 83 in exclusive OR comparators 87. The output of comparator gate 87 passes through multiplexer 96 and is combined in latch 88, AND gate 89. At time periods when the TEST MODE signal TM is present and the signal output read from the random access memory 84 and the test pattern TP on the INPUT TEST line do not compare, then the latch 88 output reset; removing the second input to AND gate 85 and thus interrupting the data to the OUTPUT LINE; and activating gate 97 which causes multiplexer 94 to bypass shift register 93. The testing operation in this embodimment is similar to that of the previous embodiment of FIG. 3, except that here each of the plural unit circuits 83 are tested in parallel, whereas in FIG. 3 each of the unit circuits 83 were sequentially addressed and tested. In the present embodiment, FIG. 4, the parallel testing rate must be limited so as to prevent excessive heat dissipation and subsequent damage of the wafer 81.

Next the STM signal from the wafer control means actuated gate 97 and energizes multiplexer 94 to bypass the SHIFT REG IN line to the SHIFT REG OUT line of each of the plural unit circuits 83, thereby connecting all shift register inputs and outputs. Simultaneously, a test pattern signal TPS is applied to the first unit circuit 83 and via multiplexer 94 to successive unit circuits. Within each unit circuit 83 the test pattern signal TPS is applied to shift register 93 and loaded into shift register 93 by pulsing the clock signal SRC n times. Then the identical test pattern TPS is applied to the n chip address lines providing first inputs to comparator 86. So long as the respective signals compare in comparator 86 output from comparator 86 is high to inverter 98, If however, a malfunction is present a low signal will be provided at the output of comparator 86 which drives inverter 98, the inverted signal passes through multiplexer 96 because of the activating signal STM to latch 88. A second input is provided to latch 88 by signal TM at selected times when the output of comparator 86 should match for properly functioning circuits. A mismatch resets latch 88 and thus holds the multiplexer 94 in the bypass position to bypass unit circuit 83 when the STM signal is subsequently removed.

Once the unit circuits 83 having both properly functioning random access memory chips 84 and shift register 93 and comparator 86 logic are determined, then unique addresses are shifted through the shift register loop by pulsing SRC to load all properly functioning registers 93 with unique addresses after the STM signal is removed. The SRC signal is removed, and all properly functioning unit circuits 83 now have unique addresses and the wafer may proceed to the operational mode. Since these unique addresses can be identical to addresses assigned to other wafers, multiple wafers can be operated in parallel to form wide words with the assurance that all bits are valid and operable when referencing these unique addresses.

Thus it is readily apparent from the foregoing that there has been formed a circuit structure capable of active self-configuration to achieve improved wafer scale integration. Further, the structure accomplishes improved wafer scale integration by active, dynamic intercoupling capable of subsequent reconfiguration. Moreover the method of self-configuration is readily adaptable to a wide variety of circuits on a wafer. It is, of course, understood that static configuration such as blowable fuses may be substituted for the dynamic latch circuits to provide a simpler one-time static configuraion. Additional means may, of course, be combined with that disclosed above to disconnect power and control lines in addition to the signal line configuration described. Simple unit circuits may include test means comprising a test generator within each unit circuit. It may be desirable to perform a final functional test on the configured wafer, since one or more of the unit circuits may have nonfunctional test circuit logic. Using the present invention the circuit complexity on a wafer can be greatly increased with the knowledge that probing, dicing and handling steps are not required and thus will not reduce wafer yields. Accordingly wafer complexity may be increased with the further assurance that maximum wafer yield and utilization will be achieved.

I claim:

1. In an integrated circuit structure: a semiconductor wafer, a plurality of unit circuits formed on the wafer, input and output lines on the wafer for carrying signals to and from the unit circuits during normal operation of the same, means for applying test signals to the unit circuits via the input lines, and means for sensing the response of each of the unit circuits to test signals and interconnecting the unit circuits with the input and output lines to form a device consisting solely of unit circuits which respond to the test signals in a predetermined manner.

2. The integrated circuit structure of claim 1 wherein the test signals are applied and the device is reconfigured each time operating power is applied to the structure.

3. The integrated circuit structure of claim 1 wherein the test signals are applied to all of the unit circuits simultaneously.

4. The integrated circuit structure of claim 1 wherein the means for applying test signals is located on the wafer.

5. The integrated circuit structure of claim 1 wherein the means for sensing the response of each unit circuit and interconnecting the circuits comprises logic circuitry forming an integral part of the unit circuit.

6. In an integrated circuit structure: a semiconductor wafer, a plurality of unit circuits formed on the wafer, input and output lines on the wafer for carrying signals to and from the unit circuits during normal operation of the same, means for applying test signals to the unit circuits via the input lines, and means included in each of the unit circuits for sensing the responses of each of the unit circuits to the test signals and interconnecting the unit circuits with the input and output lines to form a device consisting of unit circuits which respond to the test signals in a predetermined manner.

7. The integrated circuit structure of claim 6 wherein the unit circuits are interconnected in a serial manner and the means for sensing the responses and interconnecting the unit circuits includes means for comparing the responses with predetermined signals applied to the input lines and logic circuitry responsive to the comparator means for bypassing unit circuits for which the responses do not correspond to the predetermined signals.

8. The integrated circuit structure of claim 6 wherein the unit circuits are connected in parallel and the means for sensing the responses and interconnecting the unit circuits includes means for comparing the responses with predetermined signals applied to the input lines and logic circuitry responsive to the comparator means for enabling only the unit circuits for which the responses correspond to the predetermined signals.

9. The integrated circuit structure of claim 6 further including means on the wafer for temporarily connecting the unit circuits together in parallel during application of the test signals, whereby said signals are applied to the unit circuits simultaneously.

10. A dynamically configured integrated circuit structure comprising: a semiconductor wafer, a plurality of unit circuits formed on the wafer, input and output lines on the wafer for carrying signals to and from the unit circuits during normal operation of the same, means for applying test signals to the unit circuits via the input lines each time operating power is applied to the structure, and means for sensing the response of each of the unit circuits to the test signals and interconnecting the unit circuits which respond to the test signals in a predetermined manner to form a functional device.

11. In an integrated circuit structure: a semiconductor wafer, a plurality of individually addressable memory chips formed on the wafer, a common bus on the wafer for carrying signals to the memory chips during normal operation of the same, means for applying test signals to the memory chips via the common bus, and means for sensing the responses of the memory chips to the test signals and assigning addresses to memory chips which respond to the test signals in a predetermined manner.

12. The integrated circuit structure of claim 11 wherein the test signals are applied and new addresses are assigned each time operating power is applied to the structure.

13. The integrated circuit structure of claim 22 wherein the means for assigning addresses to the memory chips comprises serial shift address registers located on the memory chips and interconnected in response to the test signals applied to the memory chips.

* * * * *

UNITED STATES PATENT OFFICE
CERTIFICATE OF CORRECTION

Patent No. 4,038,648          Dated  July 26, 1977

Inventor(s)  Gilman D. Chesley

It is certified that error appears in the above-identified patent and that said Letters Patent are hereby corrected as shown below:

Claim 13 should depend from Claim 11 as follows:

13. The integrated circuit structure of claim 11 [22] wherein the means for assigning addresses to the memory chips comprises serial shift address registers located on the memory chips and interconnected in response to the test signals applied to the memory chips.

Signed and Sealed this

Twenty-first Day of March 1978

[SEAL]

Attest:

RUTH C. MASON
Attesting Officer

LUTRELLE F. PARKER
Acting Commissioner of Patents and Trademarks